US012261600B2

United States Patent
Shor et al.

(10) Patent No.: US 12,261,600 B2
(45) Date of Patent: Mar. 25, 2025

(54) METHOD FOR MITIGATION OF DROOP TIMING ERRORS INCLUDING A DROOP DETECTOR AND DUAL MODE LOGIC

(71) Applicant: Bar Ilan University, Ramat Gan (IL)

(72) Inventors: Joseph Shor, Tel Mond (IL); Yitzhak Schifmann, Bet Horon (IL); Inbal Stanger, Modiin (IL); Netanel Shavit, Ramla (IL); Edison Ramiro Taco Lasso, Quito (EC); Alexander Fish, Tel Mond (IL)

(73) Assignee: Birad—Research & Development Company Ltd. and Bar Ilan University, Ramat Gan (IL)

( * ) Notice: Subject to any disclaimer, the term of this patent is extended or adjusted under 35 U.S.C. 154(b) by 374 days.

(21) Appl. No.: 17/529,456

(22) Filed: Nov. 18, 2021

(65) Prior Publication Data
US 2022/0166431 A1 May 26, 2022

Related U.S. Application Data

(60) Provisional application No. 63/116,856, filed on Nov. 22, 2020.

(51) Int. Cl.
*G06F 1/30* (2006.01)
*G01R 19/165* (2006.01)
*H03K 19/003* (2006.01)

(52) U.S. Cl.
CPC ..... *H03K 19/003* (2013.01); *G01R 19/16538* (2013.01); *G06F 1/30* (2013.01)

(58) Field of Classification Search
CPC .. H03K 19/003; G01R 19/16538; G06F 1/30; G06F 1/08; G06F 1/10; G06F 1/26; G06F 1/28; G06F 1/3206; G06F 1/3234
See application file for complete search history.

(56) References Cited

U.S. PATENT DOCUMENTS

| 11,402,413 B1 * | 8/2022 | Mohan | G06F 1/3296 |
| 2014/0232432 A1 * | 8/2014 | Fish | H03K 19/02 |
| | | | 326/104 |

(Continued)

FOREIGN PATENT DOCUMENTS

| EP | 3734310 A1 * | 11/2020 | G01R 31/40 |
| WO | WO-2013018061 A1 * | 2/2013 | G06F 9/3869 |
| WO | WO-2013118119 A1 * | 8/2013 | G06F 9/3869 |

OTHER PUBLICATIONS

M. Cho, et. al, "Postsilicon Voltage Guard-Band Reduction in a 22 nm Graphics Execution Core Using Adaptive Voltage Scaling and Dynamic Power Gating", IEEE Journal of Solid-State Circuits, vol. 52, No. 1, Jan. 2017 (Year: 2017).*

(Continued)

Primary Examiner — Seokjin Kim
(74) Attorney, Agent, or Firm — Dekel Patent Ltd.; David Klein

(57) ABSTRACT

A technique to mitigate timing errors induced by power supply droops includes an inverter-based droop detector as well as Dual Mode Logic (DML) to achieve a droop-resistant timing response. The droop detector is based on capacitor ratios and is thus less sensitive to Process/Voltage/Temperature (PVT) and to random offset than the prior art. The DML can alter its power/performance ratio based on the droop level input it receives from the detector, such that the critical timings are preserved.

7 Claims, 11 Drawing Sheets

(56) References Cited

U.S. PATENT DOCUMENTS

2019/0265767 A1* 8/2019 Mehra .................. G06F 1/324
2019/0317546 A1* 10/2019 Born .................... G06F 1/08
2020/0310511 A1* 10/2020 Gendler ............... G06F 1/3206

OTHER PUBLICATIONS

A. Muhtaroglu, G. Taylor and T. Rahal-Arabi, "On-die droop detector for analog sensing of power supply noise," in IEEE Journal of Solid-State Circuits, vol. 39, No. 4, pp. 651-660, Apr. 2004.

M. Cho et al., "Postsilicon Voltage Guard-Band Reduction in a 22 nm Graphics Execution Core Using Adaptive Voltage Scaling and Dynamic Power Gating," in IEEE Journal of Solid-State Circuits, vol. 52, No. 1, pp. 50-63, Jan. 2017.

S. Bang et al., "An All-Digital, VMAX-Compliant, Stable, and Scalable Distributed Charge Injection Scheme in 10-nm CMOS for Fast and Local Mitigation of Voltage Droop," in IEEE Journal of Solid-State Circuits, vol. 55, No. 7, pp. 1898-1908, Jul. 2020.

C. Vezyrtzis et al., "Droop mitigation using critical-path sensors and an on-chip distributed power supply estimation engine in the z14™ enterprise processor," 2018 IEEE International Solid-State Circuits Conference—(ISSCC), San Francisco, CA, 2018, pp. 300-302.

M. S. Floyd et al., "26.5 Adaptive clocking in the Power9™ processor for voltage droop protection," 2017 IEEE International Solid-State Circuits Conference (ISSCC), San Francisco, CA, 2017, pp. 444-44.

K. A. Bowman et al., "A 16 nm All-Digital Auto-Calibrating Adaptive Clock Distribution for Supply Voltage Droop Tolerance Across a Wide Operating Range," in IEEE Journal of Solid-State Circuits, vol. 51, No. 1, pp. 8-17, Jan. 2016.

* cited by examiner

METHOD FOR MITIGATION OF DROOP TIMING ERRORS INCLUDING A DROOP DETECTOR AND DUAL MODE LOGIC

FIELD OF THE INVENTION

The present invention relates to droop detectors in circuitry.

BACKGROUND OF THE INVENTION

The supply voltage (Vdd) level of Systems-on-a-Chip (SoCs) is a critical parameter which determines their power consumption and performance. Typically, decoupling capacitors of varying sizes are placed along the Power Delivery Network (PDN) on the board, the package and the die to stabilize Vdd across a wide frequency range. However, the combination of these capacitors with the parasitic inductance of the PDN may introduce resonant frequencies to the network. Typically, three such resonances are observed, due to the respective resonances of the board, the package and the die, at frequencies ranging between 0.5 and 100 MHz. During current surges, these inductive resonances may result in Vdd droops at the corresponding frequencies.

Traditionally, these droops were treated by the addition of a guardband to the supply voltage, such that even in the presence of a droop, the Vdd level is still sufficient to enable the digital circuits to withstand the timing constraints of the system. This method, however, imposes significant additional power consumption, which scales with $Vdd^2$ and therefore with the square of the added guardband. Recently, more power-efficient solutions have been suggested to detect and mitigate such droops.

Droop detection techniques can roughly be divided into the two categories of digital and analog. Digital detectors typically translate droops to delay variations of logic gates. Some of these detectors utilize a delay line whose delay is dependent on the AC Vdd level, while others use a ring oscillator to modulate the Vdd droops on its output frequency. These solutions are fully digital and therefore simpler to design and implement, and provide a high-resolution indication of the supply level. The delay or the frequency of these detectors, however, is also highly dependent on other parameters, such as the DC Vdd level, temperature and aging, and thus require extensive backend characterization and calibration across a matrix of these three dimensions. The accuracy of these solutions is highly dependent on this 3D calibration as well as noise, which limits their utility in real-time applications.

Analog detectors utilize an analog circuit, such as a comparator, to determine when the Vdd crosses a predefined threshold, which indicates a droop. For example, utilizes a precise voltage reference and four parallel comparators to generate a four-level detection signal. The analog detectors may only require calibration at one or two temperatures but do require a precision reference voltage.

To mitigate the detected droops, previously proposed methods include adaptive clocking, instruction throttling and charge injection. During adaptive clocking, the clock frequency is temporarily reduced to withstand the larger gate delays during a droop. Instruction throttling achieves a similar effect by delaying the execution of instructions, and charge injection temporarily increases the supply level, for example by un-gating additional power gates. A disadvantage of adaptive clocking and instruction throttling is that they also temporarily reduce the performance of the device. If the droops occur very frequently, this performance loss could be significant. A disadvantage of charge injection is that it requires the power supply to be regulated on-die, and cannot support an externally generated supply, for example. Additionally, all of these solutions require the mitigation scheme to tune a circuit, such as the PLL or the regulator, which typically serves multiple clients within the SoC. This may have undesired outcomes for some of these clients. It also renders the integration of the mitigation system more complicated, as multiple end-cases and cross-effects have to be considered.

SUMMARY OF THE INVENTION

The present invention seeks to provide a novel droop-induced timing errors mitigation system, which outperforms the prior art. One embodiment of the invention comprises an inverter-based droop detector and Dual Mode Logic (DML). Compared to the prior art, the detector is more accurate, consumes less power, more PVT independent, and does not require 3D characterization or precise analog references.

BRIEF DESCRIPTION OF THE DRAWINGS

The present invention will be understood and appreciated more fully from the following detailed description, taken in conjunction with the drawings in which:

FIGS. 4A-4D are illustrations of topologies of dual mode logic (DML), in accordance with a non-limiting embodiment of the invention, in which FIG. 4A illustrates Type-A unfooted, FIG. 4B illustrates Type-B unheaded, FIG. 4C illustrates Type-A footed, and FIG. 4D illustrates Type-B headed DML gates.

DETAILED DESCRIPTION

I. Introduction

The present invention is directed to a novel droop-induced timing errors mitigation system, which outperforms the prior art. One embodiment of the invention comprises an inverter-based droop detector and Dual Mode Logic (DML).

Dual mode logic (DML) is a type of logic gate which has a high speed mode and a low power mode. The high speed mode requires more power in order to improve the performance, while the low power mode will yield a lower performance, albeit at lower power. If the voltage is reduced during a droop event, the DML logic can be switched from the low power mode to the high speed mode to maintain timing during the droop. At the lower voltage, the high speed mode can exhibit the same or faster timings than the low power mode at higher voltage. Thus, if the droop event can be detected on time, the logic can be accelerated from the low power mode to the high speed mode for the duration of the droop event. This would prevent timing errors in the digital logic design. An example of such a DML is shown in FIG. 4, in which the low power mode is achieved using static gates, while the high speed mode is achieved by dynamic logic.

Compared to the prior art, the detector is more accurate, consumes less power, more PVT independent, and does not require 3D characterization or precise analog references. To mitigate the timing errors caused by the droops, the critical paths are identified. Upon detection of droops, they alternate between the static and dynamic DML operating modes, which alter their delay, such that the timing constraints are maintained. Compared to the prior art, this solution does not degrade the performance of the system, does not tune a global system property and does not require a specific power regulator, which makes it easier to implement. Additionally, as DML introduces an enhanced power/performance trade-off relative to conventional CMOS, this solution also enables the integration of these DML advantages to the system. A TSMC 65 nm prototype was manufactured and measured, including a droop detector and a DML Ripple Carry Adder (RCA). The droop detector demonstrated a >500 MHz droop frequency detection coupled with a ±0.9% accuracy, and the RCA was shown to tolerate droops of >200 mV at Vdd=1.2V with no performance degradation.

The disclosure is organized as follows. In Section II, the droop detector architecture and its modes of operation are introduced. In Section III, the DML architecture and its operation to achieve droop mitigation are explained. Section IV provides the details of the manufactured proof-of-concept prototype. Section V presents the measurement results and Section VI discusses these results and compares them to prior art. Finally, Section VII presents conclusions.

II. Droop Detection by Offset Comparators

Figure 1:
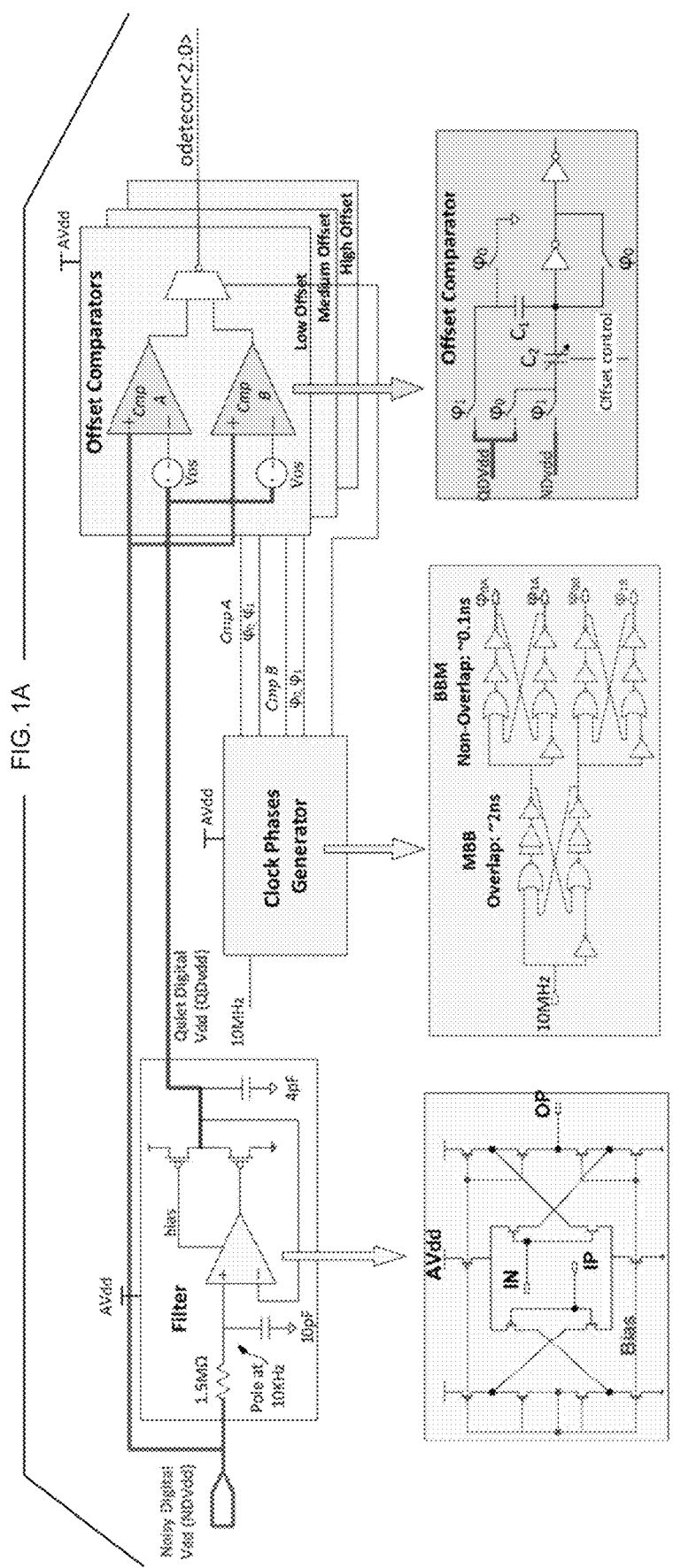
FIG. 1A is a block diagram of the droop detector top-level, comprising a parallel three droop levels detector, a filter and a phase generator, in accordance with a non-limiting embodiment of the invention.
FIG. 1B is a transistor-level diagram of the VCDA instantiated in the filter.
FIG. 1C is a diagram of the clock phase generator, consisting of one MBB circuit and two BBM circuits.
FIG. 1D is a schematic of the detector's offset comparator.

A block diagram of the proposed droop detector is presented in FIG. 1a. The detector employs (1) a supply filter and buffer, (2) three pairs of parallel clocked offset comparators and (3) a clock phase generator. The detector's input is the Noisy Digital Vdd (NDVdd) and it outputs a 3-bit thermometer code indicating the droop size, where a '000' indicates a 'no droop' state and a '111' indicates a droop that exceeds the highest droop threshold.

A. Supply Filter

The supply filter provides the nominal Quiet Digital Vdd (QDVdd) value as a reference for the offset comparators. It comprises a low-pass RC filter with a 10 KHz pole (R=1.5MΩ, C=10 pF), a decade below the lowest anticipated resonance frequency, and a unity-gain buffer which drives its output to the comparators and charges their capacitors. The unity gain buffer is a very-wide-common-mode-range differential amplifier (VCDA, FIG. 1a) followed by a PMOS source follower, which was required due to the VCDA's high output impedance. The VCDA was selected for its bias-less architecture, its wide common mode range and its low power consumption. The source follower drives the current required for charging the capacitors at the inputs to the offset comparators. A PMOS follower was selected due to the required high output voltages. A 4.5 pF capacitor was instantiated at the output of the buffer to filter the switching noises of the comparators and avoid errors due to the limited slew-rate of the buffer. The bandwidth of the buffer with the 4.5 pF capacitor at its output ranges (in simulations) between 150 KHz and 10 MHz across PVT.

B. Offset Comparator

Figure 2:
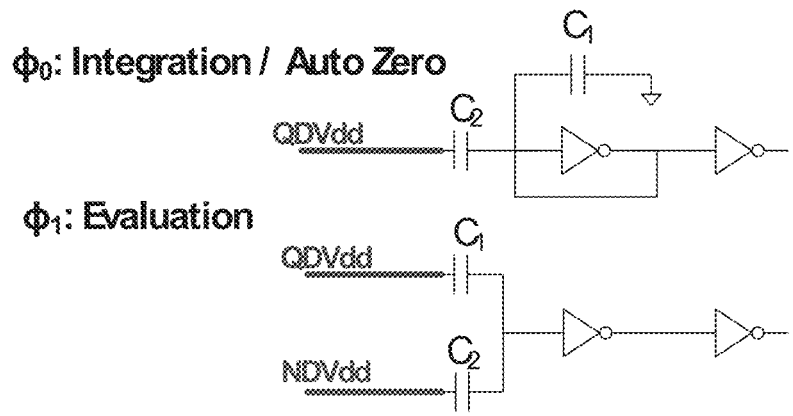
FIG. 2 is a simplified comparator diagram for each of its operation phases, integration and evaluation, in accordance with a non-limiting embodiment of the invention.

For the offset comparator (FIG. 1d), a new inverter-based comparator architecture is presented. This comparator is auto-zeroed for offset suppression, and utilizes the $C_1/C_2$ capacitance ratio to achieve the required offsets. During its integration phase (FIG. 2), $\varphi_0$, it is auto-zeroed, with $C_2$ charged to QDVdd minus the inverter trip point $V_{trip}$, and $C_1$ charged to $V_{trip}$. In its evaluation phase, $\varphi_1$, $C_1$ is connected to QDVdd and $C_2$ is connected to NDVdd, such that the charge is redistributed between the capacitors. By charge conservation, the inverter trips if the droop size, i.e.

QDVdd—NDVdd, equals QDVdd·$C_1/C_2$. A higher droop size yields a '0' at the comparator output. In other words, the comparator offset is given by $$V_{os} = QVDdd \cdot \frac{C_1}{C_2} \quad (1)$$

Note that a desired outcome of (1) is that $V_{OS}$ scales with QDVdd, such that the offsets are a percentage of NDVdd. The thresholds are tuned by switching the capacitance legs of $C_2$. A second inverter is instantiated after the auto-zeroed inverter to provide additional gain and amplify the signal to the logic levels. Both the inverters are identically sized to about X4 of the minimum, and their layout is matched to suppress mismatch.

This offset comparator architecture is less PVT dependent than the prior art since (1) the inverter structure provides a high gain across operation conditions and (2) $C_1$ and $C_2$ are MOM capacitors, which have a negligible leakage, a low offset and a virtually PVT-independent ratio. In addition, its random offset is nearly eliminated by the auto-zeroing. While the second inverter is not auto-zeroed, its design and layout match the first, and it is assumed that due to that and to the high gain provided by the first inverter, the error introduced by its trip-point mismatch is negligible.

For each of the three parallel thresholds, two comparators are instantiated in parallel such that when one evaluates ($\varphi_1$), the other integrates ($\varphi_0$), and the output of the evaluating comparator is selected. In the prototype discussed in Section IV, three comparator pairs are used, but a user could implement a different number as a function of the system's requirements.

C. Phase Generator

Figure 3:
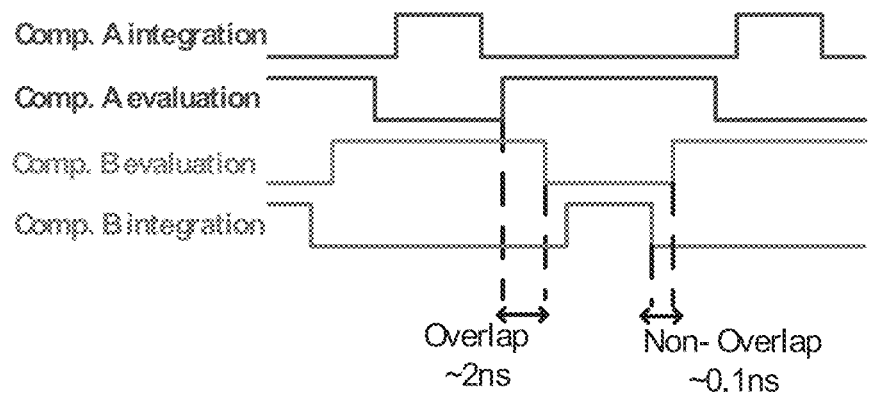
FIG. 3 is a timing diagram of the four phases at the output of the clock phase generator, in accordance with a non-limiting embodiment of the invention.

The clock phase generator, in FIG. 1c, utilizes a 10 MHz clock and instantiates a Make-Before-Break (MBB) circuit followed by two Break-Before-Make (BBM) circuits to produce the four clock phases, $\varphi_{0A}$, $\varphi_{1A}$, $\varphi_{0B}$ and $\varphi_{1B}$, required for the two comparators. As depicted in FIG. 3, the two evaluation phases, $\varphi_{1A}$ and $\varphi_{1B}$, overlap by about 2 ns to mask transition effects between the integration and evaluation phases and prevent a dead-zone in the output. The evaluation and integration phases are separated by about 0.1 ns to prevent discharge of the capacitors upon transition. In addition to the four phases, this block also generates a synchronized selector for the output multiplexors of the comparator pairs, such that the output of the evaluating comparator is driven to the detector's output. Note that if leakage of the floating node at the input to the comparator is of a concern, the clock frequency could be increased with no performance penalty besides additional power consumption.

The entire detector is supplied by a quiet Analog Vdd (AVdd), which is generally present in most systems as the IO or PLL supplies. Such requirement is common to almost every droop detector which is not delay-based. It is also possible to add a simple voltage regulator to the circuit as was done, for example, in where a similar auto-zeroed inverter was used in a temperature sensor.

II. Droop Mitigation by Dual Mode Logic

Figures 4A, 4B:
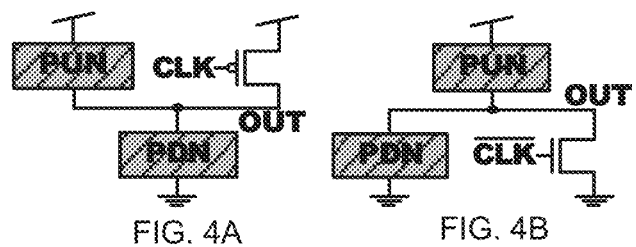
Figures 4C, 4D:
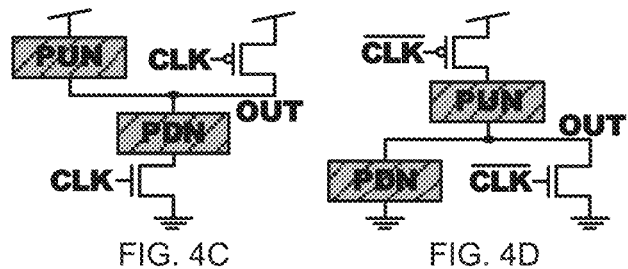

DML is a logic family which can switch between a low-power static mode, and a high-performance dynamic mode. A basic DML gate architecture is composed of an un-clocked static gate, e.g. CMOS, and an additional transistor, whose gate is connected to a global clock signal. Accordingly, at the gate-level, a generic DML gate consists of a conventional (un-clocked) static transistor (e.g., CMOS) gate with an additional clocked transistor for dynamic operation (FIGS. 4a and 4b).

To enable an interface between static and dynamic domains, DML gates may also be implemented with a footer (FIG. 4c) or a header (FIG. 4d) clocked transistor. In the first phase of the dynamic mode, the output is pre-charged (or pre-discharged) by the clocked transistor and in the evaluation phase it is either unchanged or discharged (charged). The network parallel to the clock transistor is usually sized for minimum capacitance, while the sizing of the complementary network is optimized for speed. Compared to a conventional CMOS, this sizing method reduces the input capacitance of the gate, such that higher speed in the dynamic mode and lower energy consumption in static mode are achieved. The DML design can be mixed, such that only the most critical paths are placed in the dynamic mode, while the rest of the gates save power in the static mode. The paths can also be segmented, so that parts of the design can be gradually accelerated as needed from the static to dynamic modes to transition from low power to higher performance states. A critical path replica may be utilized during this segmentation to obtain optimal pre-charge/evaluation phases. The replica is entirely in the static mode and its inputs are configured to trigger the critical path, such that a signal toggling is observed at the output of the appropriate segment according to the DML setting. One example of a DML implementation is the 28 nm FD-SOI Multiplier-Accumulator (MAC) presented in. Comparing to CMOS, this circuit provided an energy reduction of 35% at the expense of 34% frequency reduction in the static mode, and a 25% area reduction. In the mixed DML mode, it outperformed the CMOS speed by 46% and reduced its energy per operation by 9%. Additionally, in this circuit only 4% more area is required for a critical path replica.

The above DML advantages are utilized to mitigate the timing errors resulting from supply voltage droops. The dynamic mode under a lower, or drooped, supply level is at least as fast as the static mode under a higher, or undrooped, supply level. This enables the mitigation of droops by switching selected critical-path gates to the dynamic mode during a droop, such that timing constraints are maintained, and the circuit output is uncorrupted.

To enable effective droop mitigation, only the required gates are switched to the dynamic mode during the droop. This is done by identifying the critical timing paths and only accelerating the gates in these paths. Gradual acceleration is enabled by adopting the DML segmentation above. The identified paths are segmented, such that during a small droop, only some of the gates are accelerated by switching to the dynamic mode, but during a larger droop, more gates are accelerated. These critical paths could be identified using standard timing tools.

Figures 5A, 5B:
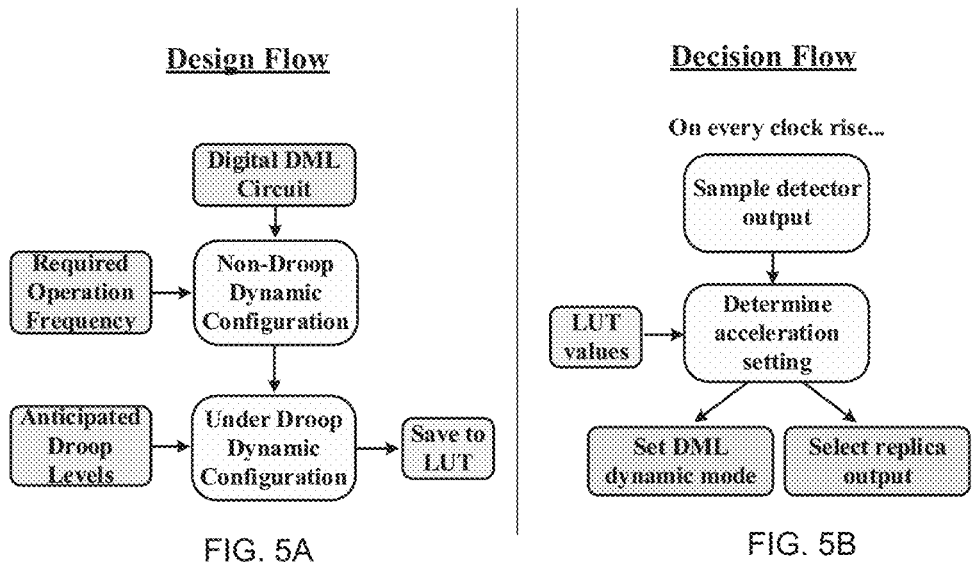
FIGS. 5A and 5B are flowcharts describing the design of the DML droop mitigation (FIG. 5A), and the acceleration decision algorithm, executed in every clock cycle (FIG. 5B), in accordance with a non-limiting embodiment of the invention.

A flowchart of the overall proposed design process is presented in FIG. 5a. First, a digital block is designed with DML gates and the requisite operation frequency is selected. Then, the nominal operation (no droop) is configured. The critical timing paths are identified and some of the DML gates in these paths are switched to the dynamic mode to enable operation at the required frequency. Finally, operation in the droop condition is determined. For a given nominal supply level (DVdd) and droop size, the critical paths are identified, and the level of acceleration is determined, such that during a droop more gates in the critical paths are in the dynamic mode than in the nominal condition. A Look-Up Table (LUT) is populated with the required acceleration levels for each DVdd and droop size. A flowchart of the correction algorithm is presented in FIG. 5b. On every rising edge of the system clock, the thermometric 3-bit output of the detector is sampled. This input is considered together with the LUT data, to determine a cycle-specific acceleration mode. This DML acceleration mode is driven to two blocks: first, to the main DML circuit where it controls the gates' states; and second, to the replica where it selects the correct DML clock.

III. Proof-of-Concept Prototype

Figure 6A:
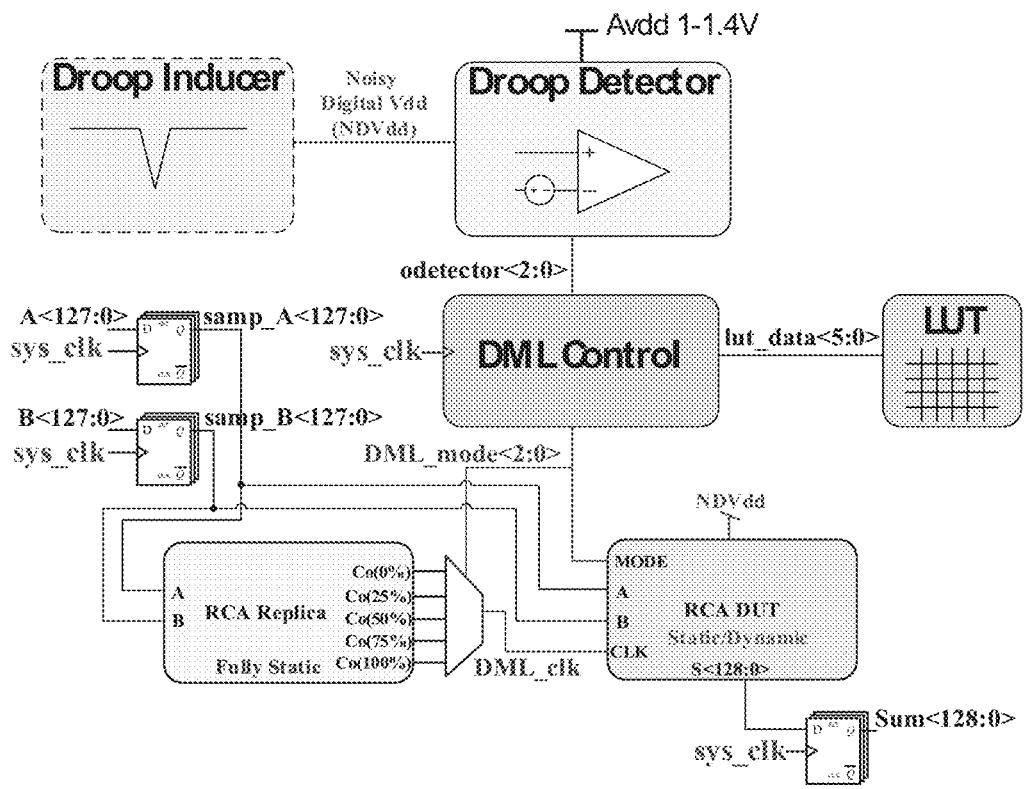
FIGS. 6A and 6B are respectively a block diagram of the droop mitigation scheme, and a schematic timing diagram depicting droops detection and mitigation, in accordance with a non-limiting embodiment of the invention.

A system-level block diagram of the prototype is shown in FIG. 6a. Droops are generated by an on-die droop inducer, which is a design-for-test circuit. NDVdd feeds a DML 128b RCA and is driven to a droop detector. The generated droops are sensed by the detector, which drives its output, "odetector", to the DML control block, which also receives the LUT data, "lut_data". This block determines the level of acceleration of the DML gates in the RCA, according to the droop size and the corresponding LUT value. The acceleration setting, "DML_mode", is driven to the replica, where it selects the replica-generated clock signal and to the RCA Device Under Test (DUT) itself, where it controls the states of the individual DML gates. A<127:0> and B<127:0> are the inputs to the RCA, driven by the test environment. They are sampled by the system clock on each rising edge and driven to both the replica and the RCA DUT. The output of the DUT is also sampled on the rising edge, and the data is driven to the test environment to verify its correctness.

TABLE I

DROOP DETECTOR CAPACITORS AND OFFSETS

| | | Pair | | | | |
|---|---|---|---|---|---|---|
| | | Low Offset | | Medium Offset | | High Offset |
| Trim* | $C_1$ | $C_2$ | Offset** | $C_2$ | Offset** | $C_2$ | Offset** |
| #0 | 5.2fF | 79fF | 6.6% | 41fF | 12.6% | 31fF | 16.7% |
| #1 | | 99fF | 5.3% | 51fF | 10.1% | 36fF | 14.3% |
| #2 | | 119fF | 4.4% | 62fF | 8.4% | 42fF | 12.5% |
| #3 | | 138fF | 3.8% | 72fF | 7.2% | 47fF | 11.1% |
| #4 | | 198fF | 2.6% | — | — | — | — |

*The offset of each comparator pair is set independently
**% of DVdd

The parallel three-level droop detector, as in FIG. 1a, detects the induced droops and outputs a three-bit thermometer code, indicating the droop size. The thresholds of the three detectors are configurable, and set according to the value of $C_2$, as in equation (1). Table I depicts the capacitor sizes and the thresholds for each comparator pair. The thresholds are the design targets, calculated by substituting the capacitors values in equation (1). The trim value of each pair is independent of the other pairs. Overall, the thresholds of the detector lie between 2.6% and 16.7% of the QDVdd.

Figure 7A:
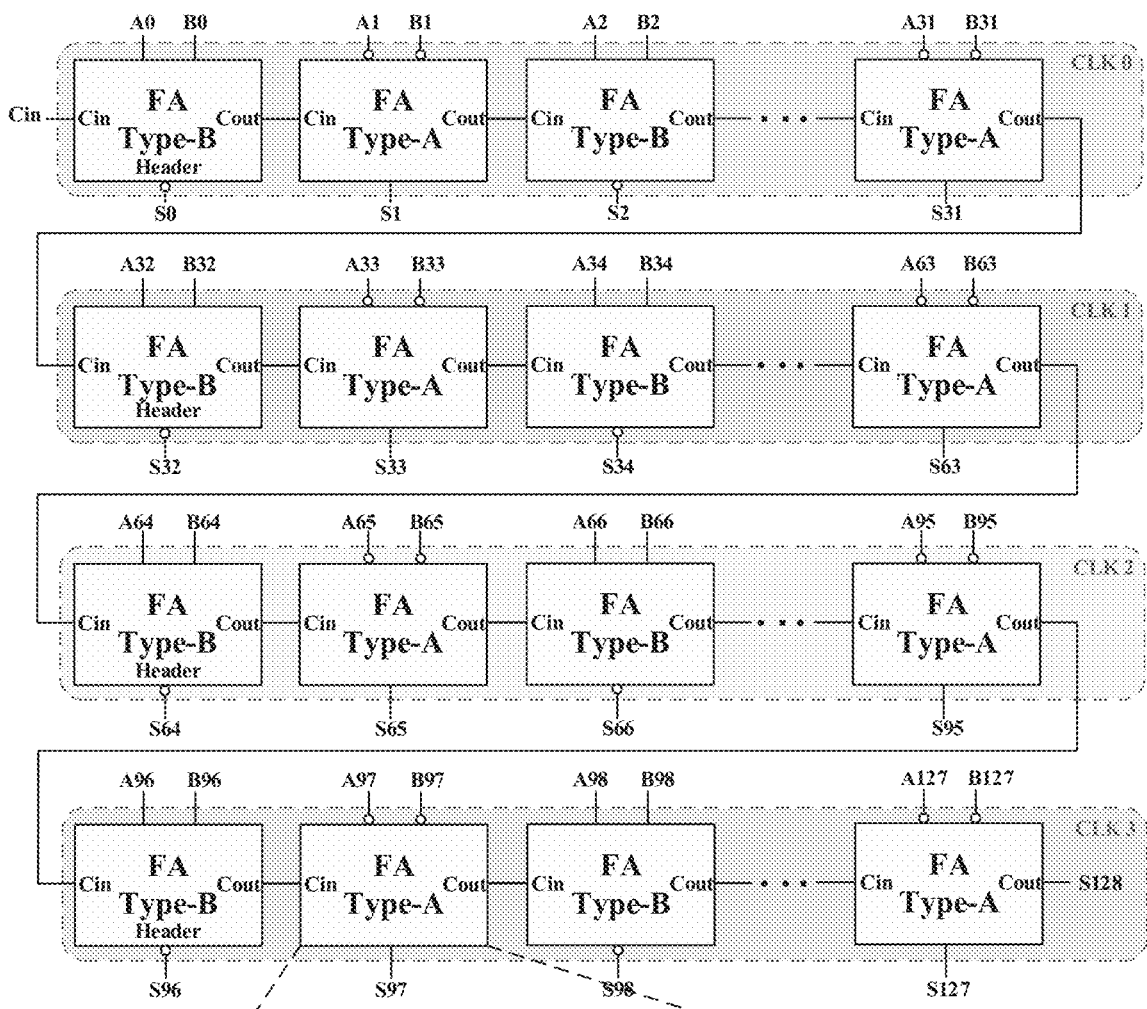
FIG. 7A is the DML 128b RCA block diagram, in which the RCA comprises 128 DML full adders which are segmented into four segments, to enable acceleration in steps of 25%.
Figure 7B:
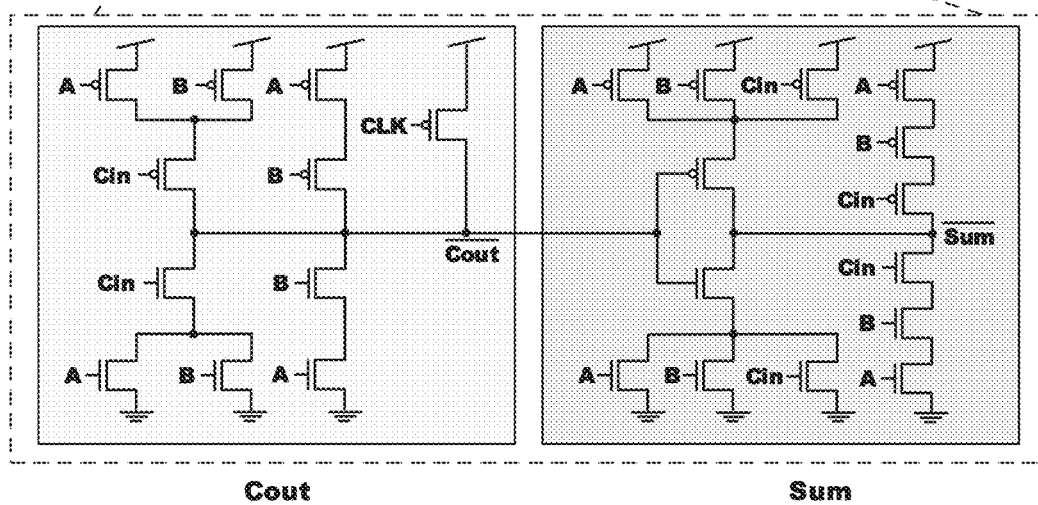
FIG. 7B is a transistor-level block diagram of a Type A DML single-bit full adder.

The logic DUT is a 128b DML RCA. The RCA is segmented into four independent DML clock domains, such that five different DML clock modes (fully static, 25% dynamic, 50% dynamic, 75% dynamic and fully dynamic) can be enabled, to achieve gradual acceleration. The 128b DML RCA, depicted in FIG. 7a, is composed of 128 DML Type-A and Type-B interleaved full adders (FAs) propagating through a carry signal. The critical path of the RCA is obtained when a carry signal propagates through all the adders; thus, the Mirror FA implementation was used. A generic Mirror FA is composed of two parts, the Sum, for summation, and the Cout, for the carry out calculation, both of them inverted. A transistor-level implementation of a single minor DML FA in Type-A is presented in FIG. 7b. The DML FA is based on the architecture of a CMOS mirror FA, with an additional clock transistor in parallel to the Pull-Up (Type-A) or Pull-Down (Type-B) networks of the Cout part, to boost the critical path. This facilitates a precharge (for Type-A) or pre-discharge (for Type B) of the carry signal during the clock pre-charge phase, such that during the evaluation phase the carry signal is changed, if needed, according to the inputs. Since this FA implementation delivers the inverted value of the carry, for an RCA structure it reduces the critical path delay by eliminating one inverter for each FA. However, the use of the mirror adders requires inverting the inputs for even FAs and inverting the outputs for odd FAs in the RCA implementation.

To allow for proper DML operation in the partially dynamic modes, footed or headed DML gates (FIGS. 4c and 4d) are used at the interface of each DML clock domain. Additionally, the partially dynamic modes are designed such that the static gates precede the dynamic gates, so that the propagation through the static gates occurs during the pre-charge of the dynamic gates. Note that in this demo, the entire logic DUT is a critical path and the phase-generating replica is a copy of the DUT in the static mode, and therefore doubles its area. In most systems, the replica would only include critical paths, which are a small percentage of the total system, and its area overhead may be considerably smaller. The DML RCA lies between registers, so that the result may be obtained within a single tunable clock cycle.

The 3-bit thermometer code is driven from the detector to a DML control circuit. The DML control utilizes this code, together with an input from a Look-Up Table (LUT), to determine the required DML clock mode, such that the RCA is accelerated based on the droop detector's output to preserve the circuit's frequency. Because the droop detector output is not synchronized, the DML control is sampled every clock cycle, such that the acceleration level of the DML remains constant throughout the cycle. The correction is thus accomplished within a resolution of one clock cycle. The LUT is preloaded with the acceleration values for different droop sizes and DVdd values, based on worst-case delay measurements across temperature.

Figure 6B:
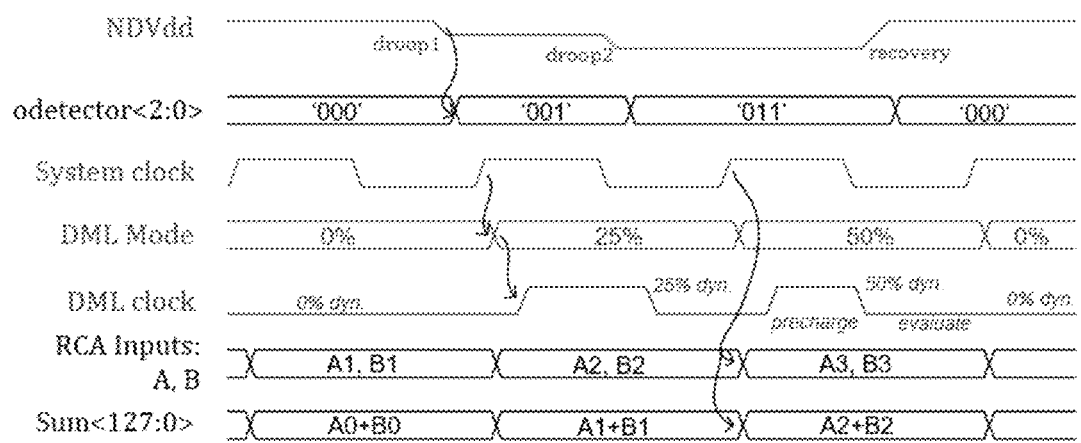

The timing diagram in FIG. 6b depicts an operation example of the prototype. It assumes that according to the LUT, once odetector<0> is '1', the DML is accelerated to 25% and once odetector<1> is '1', the acceleration is 50%. Upon a rising edge of sys_clock, odetector is sampled and DML_mode is set, which determines DML_clock. Note how the precharge phase of DML_clock, in green, changes due to the dynamic settings: for 25% dynamic it is longer, since the precharge phase represents the delay of ¾ of the gates (which are in a static mode), while for 50% it is shorter as it represents the delay of only ½ of the gates. For 0% dynamic a precharge phase is not required as no gates are in dynamic mode. Eventually, this operation results in a correct summation at Sum<128:0>.

Figure 8:
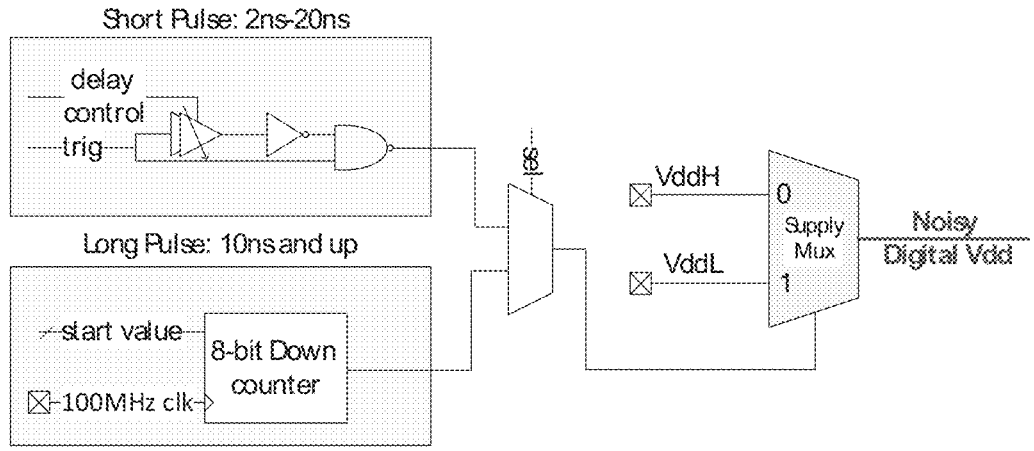
FIG. 8 illustrates the Droop Inducer, comprising an analog mux which switches between two external Vdd's, wherein the mux selector is a variable length pulse, starting at 2 ns.

A droop inducer was integrated to enable prototype testing. The inducer is capable of generating square droops, with controllable duration and size. For clarity, the duration of the droop is denoted as its width, and its size is also denoted as its depth. FIG. 8 presents a block diagram of the inducer, which comprises an analog multiplexer that switches between two external supplies and is controlled by one of two controllable-width pulse generators. The supply with the higher level, VddH, represents the nominal NDVdd and the supply with the lower level, VddL, represents the drooped NDVdd. During an induced droop, NDVdd switches from VddH to VddL and back to the VddH. The mux selection signal is a variable-width pulse generated by one of two mechanisms. The first is based on a variable delay which can apply pulses from 2 ns to 20 ns in steps of 2 ns, and the second is a down counter, which counts the cycles of a 100 MHz clock and can impose droops of 10 ns or longer in steps of 10 ns. This structure makes it possible to control both the width of the droop, by changing the selection pulse width, and the depth of the droop, by tuning the analog inputs of the mux. The fast transition to droops, about 100 ps (simulated) enables accurate testing of the delay of the detector. The mux structure enables thorough characterization of the detector and the mitigation system across a wide and controlled range of droops.

IV. Measurements Results

Figure 9:
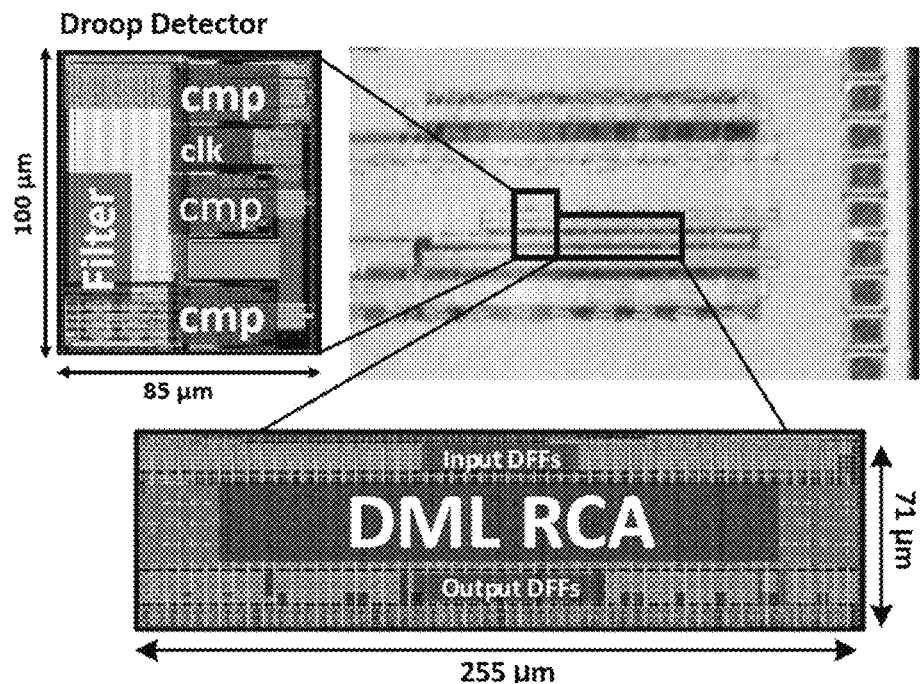
FIG. 9 illustrates die micrograph and layout screenshots of the droop mitigation prototype, fabricated in TSMC 65 nm process node.

A demonstration of the droop mitigation system was designed and manufactured in TSMC 65 nm. A die micrograph and the layout of the prototype are shown in FIG. 9. Several chips were measured across a temperature range of 10° C. to 90° C., an AVdd range of 1.0V to 1.4V and a DVdd range of 0.6V to AVdd-0.1V. Since the filtered NDVdd is buffered by the unity gain buffer which is fed by AVdd (FIG. 1), a 100 mV difference must be maintained between AVdd and DVdd to prevent an offset in the buffer output.

A. Stand-Alone Droop Detector

Figure 10:
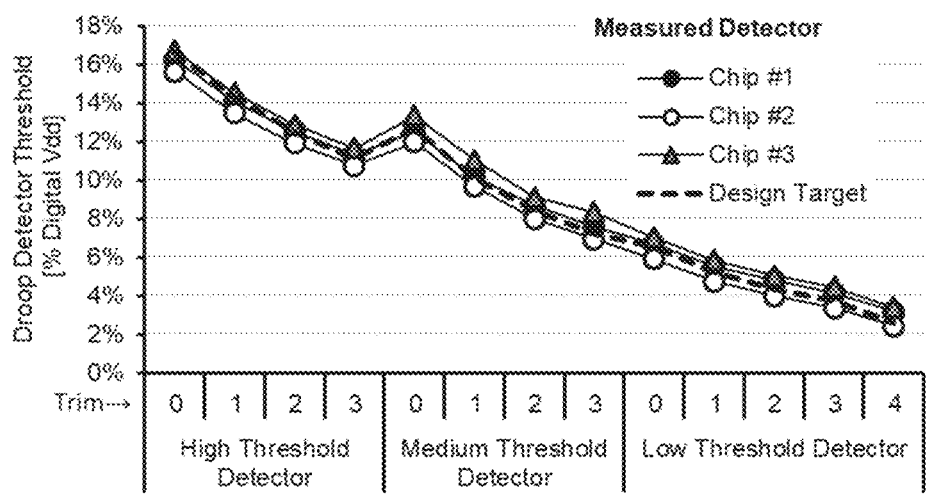
FIG. 10 illustrates measured droop detector thresholds (trip points) across three chips relative to the design target.

FIG. 10 presents the design target, given by the capacitance ratio calculated by (1) and given in Table I, relative to the measured droop detector thresholds across the three chips, measured at a nominal condition (40° C., AVdd=1.2V and DVdd=1.0V). It shows that the chip-to-chip and chip-to-target distributions are tight. The maximal chip-to-chip difference is 1.4% of DVdd, and the maximal chip-to-target difference is 1.1% of DVdd. Since there are multiple thresholds per comparator, this difference can be calibrated at a single temperature. Multiple comparator pairs may operate simultaneously and detect crossings of different droop thresholds.

Figure 11:
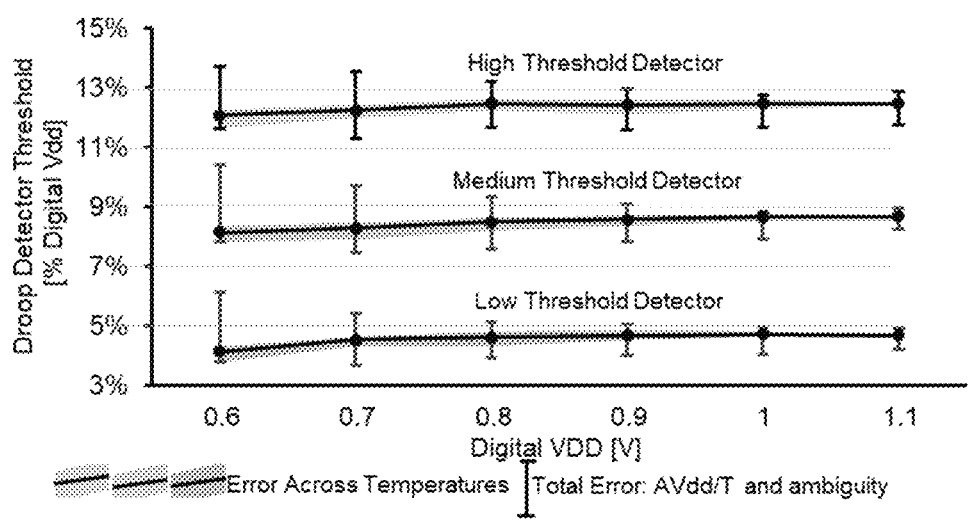
FIG. 11 illustrates measured droop detector thresholds (trip points) including the errors from all error sources: A/DVdd, Temperature, noise and mismatch.

The sources of inaccuracy of the detector include charge injection from the switches to the capacitors, thermal noise, Vdd/temperature variations, and gain mismatch. For 0.8V≤DVdd≤1.1V, these errors accumulate up to ~0.9% (7 mV) ambiguity of the comparator trip-point, i.e., its threshold. If the DVdd range is extended to down to 0.6V, the error increases up to ~2.3% (14 mV), in part due to offsets in the buffer and in part since when the DVdd is lower, a given error in mV translates to a larger percentage error. The measured total error of the detector is presented in FIG. 11, for step #2 of each of the 3 sub-detectors in one of the measured chips. For each DVdd value (x-axis), the error across all the measured range of AVdds and temperatures is presented. The colored bands around the curves represent the temperature-related error only, which translate to an error of up to 0.43% in the worst case, for DVdd=0.6V. The total error is given in FIG. 11 in the error bars. The largest error contributor is the decreased comparator gain for AVdd=1.0V. In addition, simulations of skewed Si, which was not available for us to measure, demonstrate a low error of up to 2.2% across PVT. In the worst-case PVT, the leakage-induced degradation at the input to the comparator was about 1.5 mV during the 10 MHz clock period. Monte-Carlo simulations show an error with a standard deviation of 0.35% of DVdd. Note that relative to the design target, no favorable error direction, either positive error or negative, could be observed in the measurements (FIG. 11). This indicates that the contributions of deterministic offsets, such as charge injection or parasitic capacitances, are minor.

Figure 12:
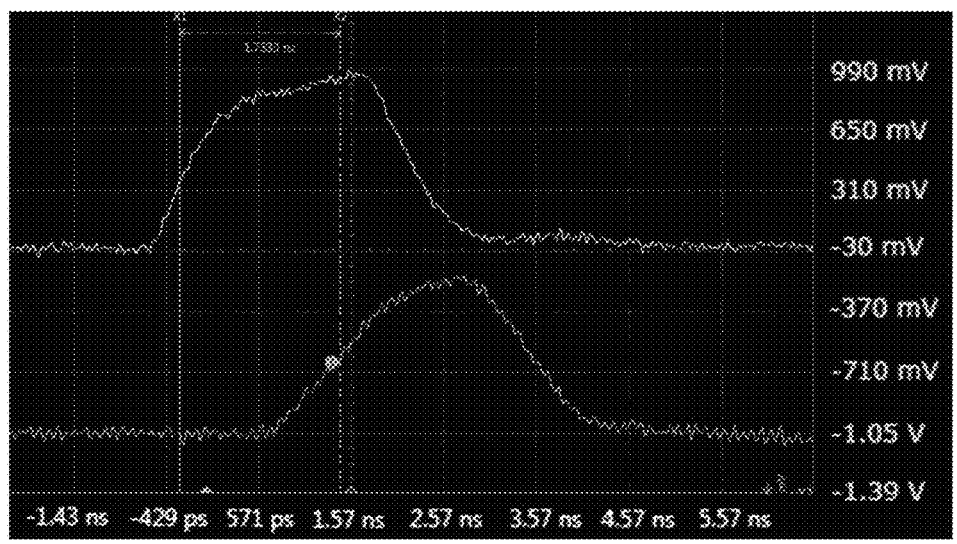
FIG. 12 illustrates measured oscilloscope waveforms depicting the detection of a 2 ns droop. Top: Droop-inducing pulse. Bottom: Detector (comparator) output.
Figure 13:
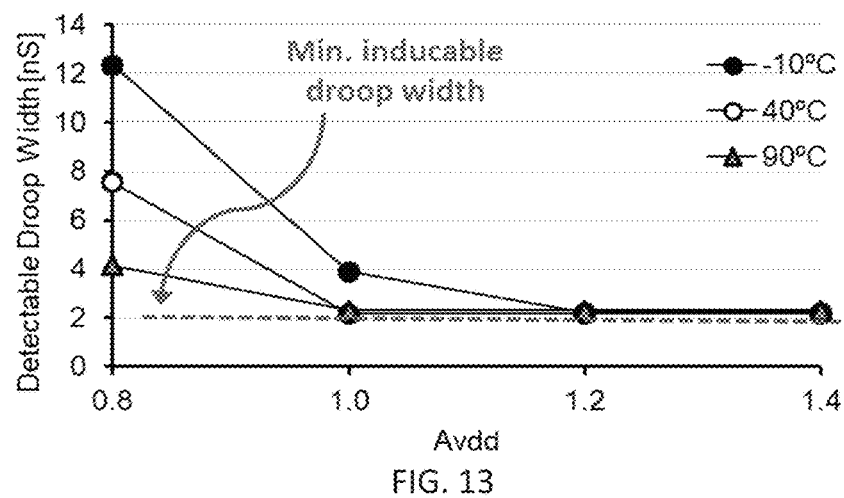
FIG. 13 illustrates measured minimum detectable droop width across AVdd and temperature; for AVdd≥1.0V, the entire required droop frequency range is covered.
Figure 14:
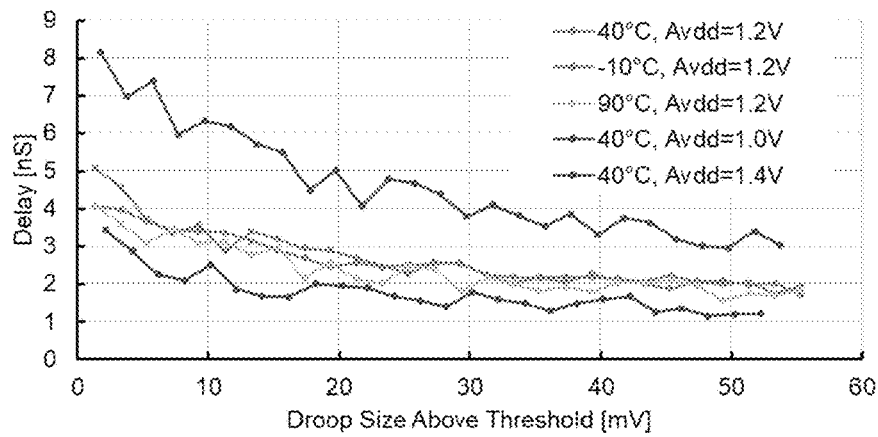
FIG. 14 illustrates measured droop detector delay for varying droop sizes.
Figure 15:
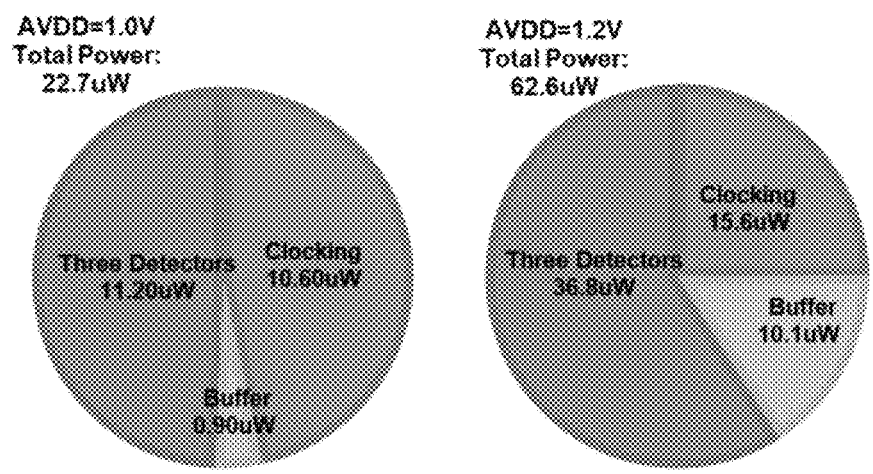
FIG. 15 illustrates measured droop detector power break-up for AVdd=1.0V and 1.2V.

In order to measure the speed of the detector, the delay time and the minimum detectable droop width were tested. As mentioned, the minimum droop width that the droop inducer was capable of producing was 2 ns. This can characterize the most important droops which are generally less than 100 MHz. In FIG. 12, oscilloscope waveforms of a detection of a ~2 ns droop are presented. The top waveform is the pulse that generates the droop, i.e., the 'select' signal of the analog supply multiplexer in the droop inducer (FIG. 8). The bottom waveform is the output of the droop detector. Note that due to a limited probing functionality, the transient waveform of NDVdd could not be captured. The minimum detectable droop widths across AVdd and temperature are charted in FIG. 13. For AVdd≥1.0V, the detector was capable of detecting the entire required droop frequency range. The delay times of the detector are depicted in FIG. 14 across AVdd and temperature and for varying droop depths. Cross-PVT simulations for droop size of 20 mV above the threshold show delay that varies between 1.1 ns and 2.7 ns for AVdd=1.3V, where simulations of typical material show a delay of 1.7 ns, very close to the measured delay at that condition, about 2 ns. The measured power consumption of the detector for typical material at 40° C. ranged from 22.7 µW for AVdd=1.0 to 62.6 µW for AVdd=1.2V, as in FIG. 15. Simulated power consumption of skewed Si for the entire detector (three comparators, filter and clocking) across voltage and temperature, ranged from 16.1 µW (SS, 10° C., 1V) to 116 µW (FF, 110° C., 1.2V). There is a clear tradeoff between power and speed demonstrated here, where for AVdd=1.4V the delay was less than 2 nS when the droop depth was more than 15 mV above the threshold, whereas for AVdd=1.2V the delay increased to about 2-3 nS and for AVdd=1.0 the delay was 5 nS (FIG. 14). This is a result of the improved inverter-amplifier bandwidth.

B. DML RCA

Figure 16:
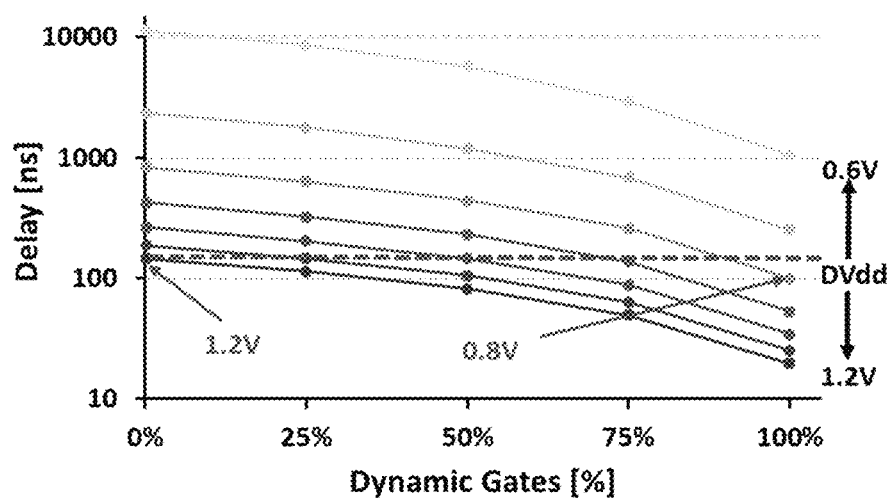
FIG. 16 illustrates measured RCA delay time for varying DVdd and acceleration settings.

To characterize the RCA, the adder was tested across the applicable DVdd and temperature range. For each DVdd, temperature and DML acceleration setting, the delay time of the RCA was measured. This was done by gradually decreasing the clock cycle time until an erroneous response was captured in the output FFs. The results for T=40° C. are depicted in FIG. 16. For each DVdd between 0.6V and 1.2V, the delay decreased by roughly 10× between the 0% and 100% dynamic modes. It may be noted that a target delay could be obtained for different power supplies by an application of different DML clock modes. This demonstrates the potential of DML gates in mitigating droops, as discussed in Section III. To derive the LUT, for each DVdd, the reference frequency was set to be the frequency in the fully static mode. The cross-temperature measurements were considered, and the worst-case required acceleration was utilized for each DVdd and anticipated droop size. The LUT of the required DML accelerations for different DVdd's and anticipated droops is presented in Table II. Note that the non-monotonicity is due to the different trim levels of the three comparator pairs.

TABLE II

Prototype Look-Up Table

| Droop Size [0/0 DVdd] | Detector Output | DVdd [V] | | | | | |
|---|---|---|---|---|---|---|---|
| | | 1.2 | 1.1 | 1 | 0.9 | 0.8 | 0.75 |
| 0%-4% | 000 | 0 | 0 | 0 | 0 | 0 | 0 |
| 4%-8% | 001 | 50 | 25 | 25 | 50 | 50 | 50 |
| 8%-12.5% | 011 | 50 | 50 | 50 | 75 | 75 | 100 |
| 12.5%-18% | 111 | 75 | 50 | 75 | 100 | 100 | 100 |
| | | | | | Required DML Acceleration [%] | | |

Figure 17:
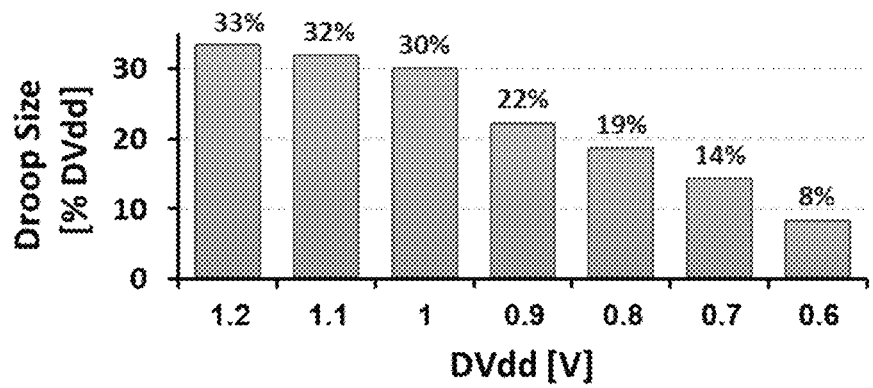
FIG. 17 illustrates measured maximal correctable droop size from the DML RCA perspective; while these values exceed the detector's threshold by up to X2, the robustness of the DML as a droop mitigator is demonstrated.

According to these measurements, the maximal correctable droop was calculated for each DVdd level, as presented in FIG. 17. Droops as high as 33% could be corrected for DVdd=1.2V. While these droop sizes may exceed realistic anticipated droops as well as the droop detector's highest threshold, they demonstrate the robustness of the DML droop mitigation concept.

C. Droop Mitigation System

Figure 18:
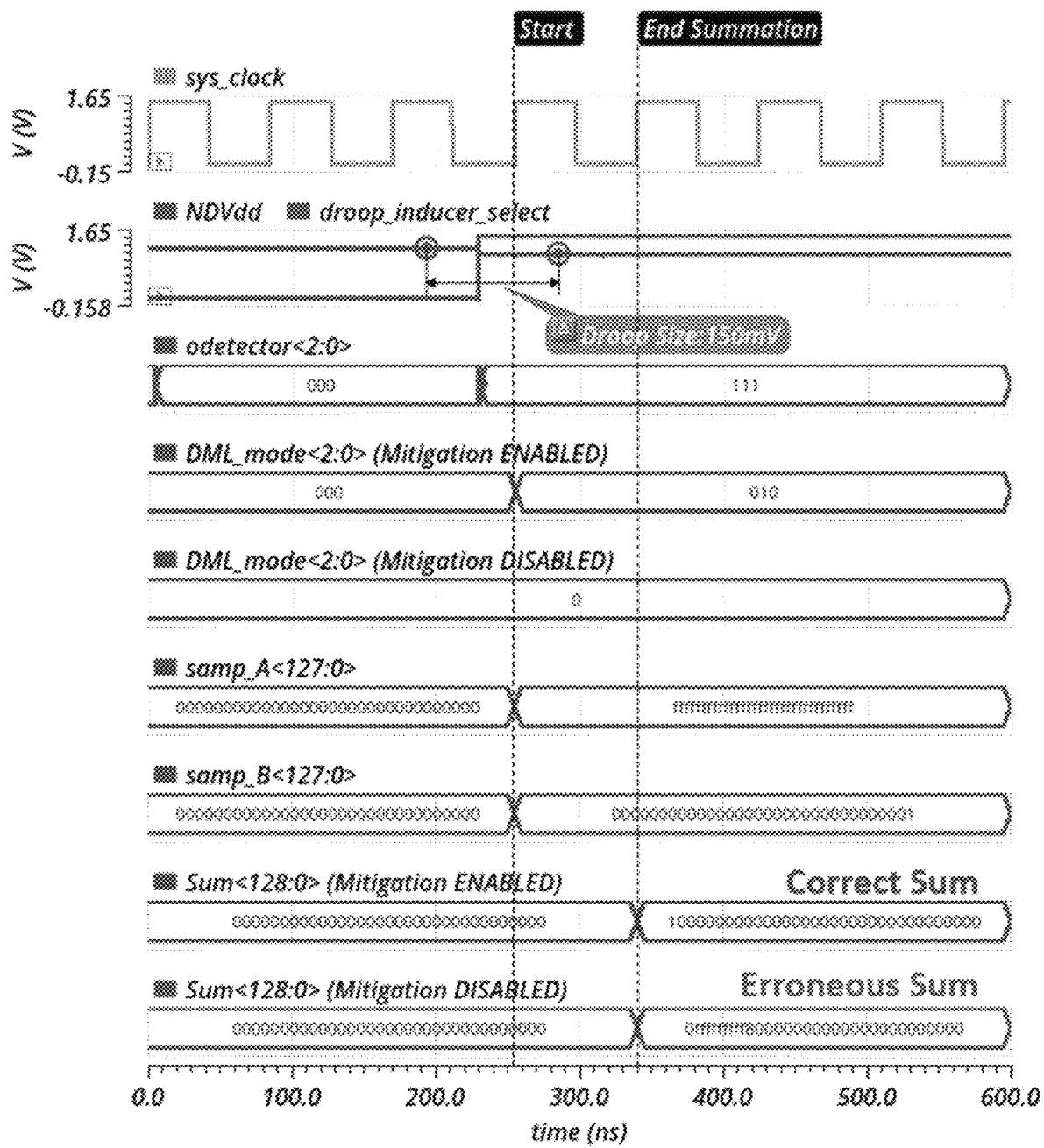
FIG. 18 illustrates simulated waveforms of the RCA and the mitigation system (FIG. 6) when the mitigation is enabled and correct sum is obtained, and when it is disabled and incorrect sum is sampled.

In this prototype, it is assumed that the required operation frequency is the fastest frequency that the fully static mode can support. This selection provides the lowest energy consumption for each addition operation. A simulated example of the operation of the mitigation system is provided by the waveforms presented in FIG. 18, which is a simulation of the system in FIG. 6. In this example, a 150 mV droop was injected and two scenarios were simulated. In the first, the mitigation system was enabled and in the second it was disabled. The clock period was set to 85 ns, the delay of the RCA when no droop is present, such that if the mitigation was disabled, the RCA's delay exceeds the clock period and an incorrect sum was sampled. Observe how when the mitigation was enabled, DML_mode was switched from '000' to '010' while when it was disabled, it remained '000'. The inputs to the RCA are set to trigger the critical path, where "A<127:0>" is 'all 1' and "B<127:0>" is '00 . . . 001'. FIG. 18 presents the sampled version of A and B, after the flip-flops. When the mitigation is enabled, the correct summation result, '100 . . . 00' was sampled on "sum<128:0>" (blue waveform), while when it is disabled, an incorrect result is sampled (red waveform).

Figure 19:
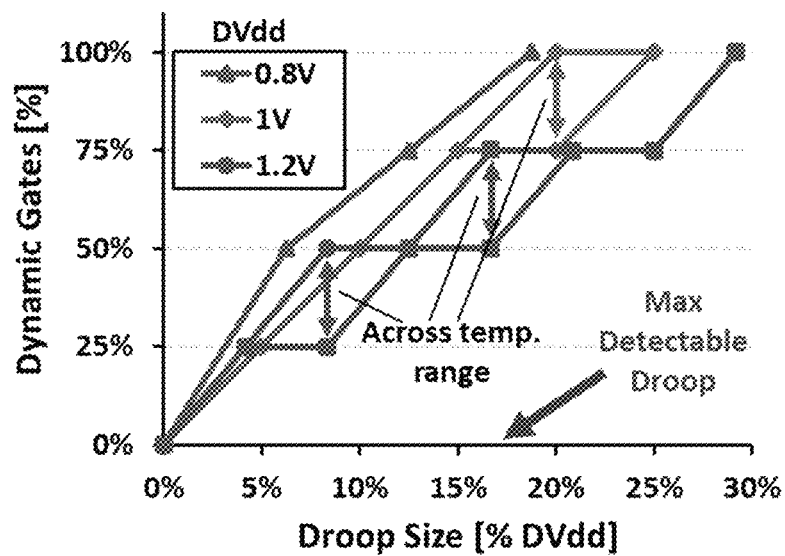
FIG. 19 illustrates measured required LUT values of acceleration for % droop across DVdd and temperature to stand given droop sizes.

To measure the overall scheme performance, different droop depths and LUT values were applied, and the fraction of dynamic gates required to compensate for each given droop was found across the range of correctable droops. The results are presented in FIG. 19. Droop sizes larger than the maximal detectable droop size are also correctable, at the expense of larger power consumption during lower size droops. For example, assume that the threshold of the detector is set to its maximum, 16.7% of the DVdd, and the required acceleration to withstand this droop size is 75% dynamic, as is the case for DVdd=1.2V. At this acceleration, droops of up to 25% DVdd could be corrected. A user, however, may wish to correct droops of 30% as well, and could set the LUT to accelerate to 100% dynamic when the 16.7% threshold is crossed, and his target is thus achieved at a tradeoff of excessive acceleration and power for droops of 16.7%-25% of DVdd.

Figure 20:
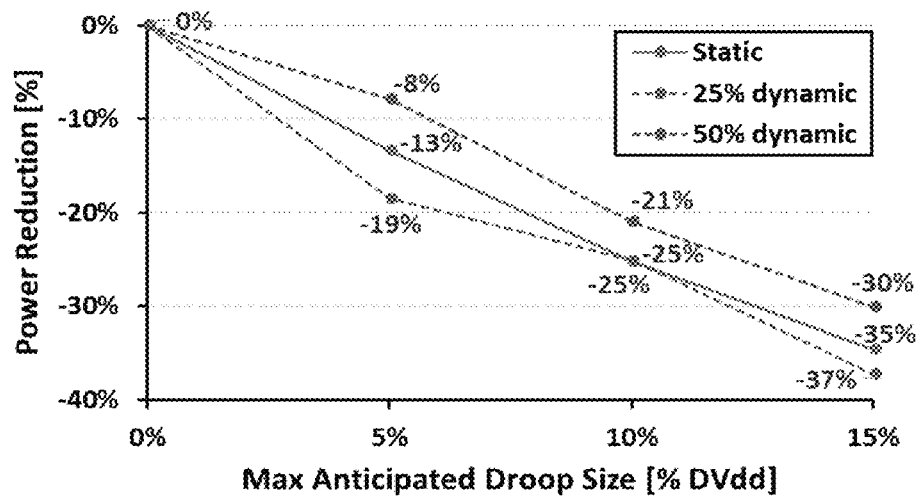
FIG. 20 illustrates measured power savings of DML RCA vs. the maximal anticipated droop size for various non-droop operation modes: static, 25% dynamic and 50% dynamic.

To calculate the achievable power reduction of the DML RCA, the operation frequency was assumed to be the maximal frequency for DVdd=1.0V in the fully static mode. The benchmark for the power reduction is the RCA power consumption when no mitigation is available. In this case, the minimal required DVdd of 1.0V is increased by the maximal anticipated droop size, as well as 25 mV additional guardband. For example, if droops of up to 100 mV are anticipated, the required DVdd is 1.125V. When a droop mitigation system is available, the minimal DVdd is not increased by the maximal droop size, but a larger guardband is required due to the minimum detectable droop size, so the DVdd equals 1.0V+50 mV guardband. The power savings are the differences between the power consumptions for the higher and lower DVdd's for the anticipated droops. The results are depicted in FIG. 20. If the anticipated droops are 15% of the DVdd, a 35% power reduction can be achieved.

FIG. 20 also depicts the potential power reduction if the RCA is operated in 25% or 50% dynamic mode, to enable faster operation frequency. Note that negligible power increases occur in the dynamic mode because of the lower voltage during the droops (e.g., an additional power of only 0.7% was measured as a result of the transition of 50% of the gates to the dynamic mode for NDVdd=1.05V and Droop=150 mV).

V. Discussion

A performance summary and a comparison to recent prior art are presented in Table III. The DML mitigation scheme does not degrade the digital logic's performance, as do adaptive clocking and instruction throttling, and the DVdd and power reduction enabled by this scheme are the largest presented in the literature. The proposed scheme exhibits the lowest detector area, the lowest detector power and the highest detector accuracy. The delay time is comparable to prior art, despite the fact that this work is in an older technology. Prior detectors that rely on delay measurements require complex 3D characterization across the DC voltage, temperature and aging conditions. This droop detector is insensitive to these factors and only requires a calibration point at a single temperature to compensate for random mismatch. In addition, the detector does not require a precision external reference as do other analog works, except for a quiet analog supply which generally exists in any system.

Although the measured demo represents a simplified droop mitigation system, the concept can be adapted to a complete system. Note, first of all that the droop detector was not simplified and a user could adjust the number of comparators and the thresholds according to needs.

In a full system, implementation aspects of the replica may be considered. First, in this demo, the replica doubled the power consumption of the RCA in the static mode since the entire RCA is a critical path. However, in a fully functional system, the replica will only be a small percentage of the gates and will operate in the static mode alone. Additionally, the replica in this demo provided the same delay of the original path as it was an exact copy of the RCA.

TABLE III

PERFORMANCE SUMMARY AND COMPARISON WITH PRIOR-ART

| | This invention | (3) JSSC'20 | (4) ISSCC'18 | (5) ISSCC'17 | (2) JSSC'17 | (6) JSSC'16 | (1) JSSC'04 |
|---|---|---|---|---|---|---|---|
| DROOP MITIGATION SYSTEM | | | | | | | |
| Process | 65 nm | 10 nm | 14 nm | 14 nm | 22 nm | 16 nm | 90 nm |
| Mitigation Scheme | Dual Mode Logic | Charge Injection | Instruction Throttling | Adaptive Clocking | Dynamic Power Gating | Adaptive Clocking | No Mitigation Presented |
| Digital Vdd Reduction | 12% (DVdd = 1.0 V, Droop = 166 mV) | 6.7% | — | — | 11% | — | — |
| Power Reduction | 25% (DVdd = 1.0 V, Droop = 100 mV) [1] | 7%-14.5% | 8%-14% | — | 10% | 5%(0.9 V)-13%(0.6 V) | — |
| Performance Degradation During Droop | Not Degraded | Not Degraded | Degraded | Degraded | Not Degraded | Degraded | — |
| DROOP DETECTOR | | | | | | | |
| Architecture | Offset Comparators | Delay Measurement | Delay Measurement | Flash A/D | Delay Measurement | Delay Measurement | Calibrated Comparator |
| Power [pW] | 22 (AVdd = 1.0 V) 62 (AVdd = 1.2 V) | 1480 | — | — | — | 2500 | — |
| Area [um$^2$] | 8,500 | — | 12,000 | 12,875 | — | 2590 | — |
| [F$^2$] [2] | 2M | — | 61M | 65M | — | 10M | — |
| Detector Vdd Range [V] | 1.0-1.4 (AVdd) | 0.6-1 | — | 1.5 | 0.7 | 0.6-0.9 | 0.7-1.3 |
| Digital Vdd Range [V] | 0.8-1.2 | 0.6-1 | — | — | 0.7 | 0.6-0.9 | 1 |
| Detectable Droop Magnitude [% Dig. Vdd] | 2.6%-16.6% | 0%-30% | — | — | — | 10% | 27% |
| Response Time | 3.5 ns (AVdd = 1.0 V) 2 ns (AVdd = 1.2 V) | 2 ns | — | 2.3 ns | — | 2.4 ns | — |
| Threshold Temperature Dependence [% / 100° C.] | 0.4% ± (Dig. Vdd ≥ 0.8 V) | Not Reported [3] | Not Reported [3] | Not Reported | Not Reported [3] | Not Reported [3] | Not Reported |
| Accuracy | ±0.9% (Dig. Vdd ≥ 0.8 V) | ±2.9% | 1±% | 1±% (Simulated) | — | — | — |

[1] - For the measured prototype. In a full DML system, this performance could be maintained if all the critical paths are identified and adjusted during droops.
[2] - F is the minimum feature size of the process. The size in F2 is given for fair comparison, as the compared works were manufactured in different processes.
[3] - No specific data were stated in the paper. Delay-based circuits are known to have a substantial temperature dependence.

REFERENCES

1) A. Muhtaroglu, G. Taylor and T. Rahal-Arabi, "On-die droop detector for analog sensing of power supply noise," in *IEEE Journal of Solid-State Circuits*, vol. 39, no. 4, pp. 651-660, April 2004.

2) M. Cho et al., "Postsilicon Voltage Guard-Band Reduction in a 22 nm Graphics Execution Core Using Adaptive Voltage Scaling and Dynamic Power Gating," in *IEEE Journal of Solid-State Circuits*, vol. 52, no. 1, pp. 50-63, January 2017

3) S. Bang et al., "An All-Digital, VMAX-Compliant, Stable, and Scalable Distributed Charge Injection Scheme in 10-nm CMOS for Fast and Local Mitigation of Voltage Droop," in *IEEE Journal of Solid-State Circuits, vol. 55*, no. 7, pp. 1898-1908, July 2020.

4) C. Vezyrtzis et al., "Droop mitigation using critical-path sensors and an on-chip distributed power supply estimation engine in the z14™ enterprise processor," 2018 *IEEE International Solid-State Circuits Conference—(ISSCC)*, San Francisco, CA, 2018, pp. 300-302.

5) M. S. Floyd et al., "26.5 Adaptive clocking in the POWER9™ processor for voltage droop protection," 2017 *IEEE International Solid-State Circuits Conference (ISSCC)*, San Francisco, CA, 2017, pp. 444-445.

6) K. A. Bowman et al., "A 16 nm All-Digital Auto-Calibrating Adaptive Clock Distribution for Supply Voltage Droop Tolerance Across a Wide Operating Range," in *IEEE Journal of Solid-State Circuits*, vol. 51, no. 1, pp. 8-17, January 2016.

In more complex circuits, special care may be taken during the replica design. An insufficient precharge phase may result in an increased overall path delay and an incorrect result, while a too long precharge phase results in an increased delay and reduced performance. The replica may comprise the same logic gates as the original path with similar loading gates, and interconnects as similar as possible for maximal matching across PVT. To confirm an error-free operation, it is recommended to slightly increase the replica's delay such that random mismatch may not result in an insufficient precharge phase.

In multi-core, large SoCs, droops are not only temporal but also spatial. For example, one core could experience a droop while others not. To address this, multiple mitigation systems may be instantiated in a single SoC, where each includes a detector, DML gates and replicas, and DML control. The proposed detector is advantageous over prior art, since it is the smallest, lowest power and requires a relatively simple calibration compared to the prior-art (especially delay-based detectors). From the mitigation standpoint, other solutions may be globally implemented at the circuit level. For example, adaptive clocking may be able to adjust a single clock source, if it is applied to the entire chip. The proposed mitigation may have to be instantiated separately in each sensitive area. While this is more complex to design at the circuit level, it may be simpler to integrate at the global SoC level. When a global property, such as a clock frequency, is changed, multiple implications and end-cases have to be considered, whereas the integration of the DML is seamless from that perspective.

VI. Conclusion

Supply droops may result in a major increase in the power consumption of modern SoC's, since a voltage guardband is required to maintain timing. Recently, droop detection and mitigation schemes have been proposed which make it possible to decrease this guardband and significantly reduce the power consumption.

The invention provides a droop detection and error mitigation scheme that outperforms previous schemes. The invention comprises a droop detector and a mitigation system. The detector may include a novel inverter-based, auto-zeroed offset comparator, whose offset is determined by the ratio of MOM capacitors and scales to the DVdd. The detector filters the noisy Vdd to generate a clean reference, such that an external accurate analog reference is not required. This offset comparator architecture was never introduced before in droop detectors. Its advantages over prior comparator-based droop detectors include, inter alia, the following:

(1) It compares the noisy Vdd to its nominal value, which is easy to achieve using a filter. It does not require any external accurate reference.
(2) It relies on the capacitors' ratio, which make it less sensitive to PVT.
(3) It is compact, mismatch resistant and low power.
(4) An additional advantage over digital, delay-based droop detectors is that it does not required a complex 3D calibration (across temperature, supply voltage and aging).

Accordingly, in one version of the droop detector, a noisy supply voltage to be measured is coupled to the amplifier in the first and second cycles, and a reference voltage is coupled to the amplifier in the second and first cycles. The noisy supply and reference voltages may be AC coupled through a capacitor. AC coupling involves using a capacitor to filter out the DC signal component from a signal with both AC and DC components. The capacitor is in series with the signal. The DC component of the signal acts as a voltage offset, and removing it from the signal may increase the resolution of signal measurements. AC coupling is also called capacitive coupling. In the droop detector, the reference voltage may be a filtered version of the noisy supply voltage The mitigation system utilizes Dual Mode Logic (DML) gates that can switch either to static mode (slow) or to dynamic mode (fast) on-the-fly. A digital design based on DML gates can maintain a given performance target during droop events. During droop events, the critical timing paths can adopt a proper configuration in which segments of the critical timing paths switch from the static to dynamic mode, to maintain delay time and avoid timing errors. This mitigation approach directly modifies the logic gates instead of modifying a global SoC property, making it easier to integrate. In addition, it does not degrade the performance of the system, even temporarily.

A prototype manufactured in TSMC 65 nm demonstrated the applicability of the invention. This prototype incorporated a detector capable of detecting three tunable droop thresholds simultaneously, with a DML ripple carry adder (RCA). Accurate and fast detection was shown, with a worst-case accuracy of ±0.9% of DVdd and a delay time of 2 ns, better or similar to prior art. The power and area of the detector, 62 µW and 2M $F^2$ respectively, were substantially lower than prior art. The manufactured mitigation scheme, comprising the detector and the RCA, was shown to mitigate errors caused by droops as high as 16% of the DVdd, with a potential DVdd reduction of 12%. The mitigation concept demonstrated by the RCA may be adopted to larger scale digital circuits and still provide similar power improvement by following the same design principles.

What is claimed is:

1. A logic circuit comprising:
   a dual mode logic (DML) unit comprising logic gates with a low power mode and a high speed mode; and
   a droop detector coupled to said DML logic unit and operative to detect a droop in a supply voltage to said logic circuit, wherein upon detecting said droop, said droop detector is operative to activate an accelerated mode in said DML logic unit in order to maintain timing constraints of said logic circuit.

2. The logic circuit according to claim 1, wherein the DML unit comprises an un-clocked static transistor gate coupled to an additional clocked transistor for dynamic operation.

3. The logic circuit according to claim 1, wherein said droop detector mitigates droop-induced timing errors in said logic circuit.

4. The logic circuit according to claim 1, wherein maintaining the timing constraints comprises alternating between static and dynamic operating modes of said DML unit.

5. The logic circuit according to claim 4, wherein alternating between the static and dynamic operating modes alters delays in critical paths of said logic circuit.

6. The logic circuit according to claim 2, wherein a replica DML circuit is utilized to generate a clock of said additional clocked transistor.

7. The logic circuit according to claim 1, wherein said droop detector comprises multiple droop magnitude thresholds and a look-up table is utilized to determine a degree of logic acceleration based on a droop magnitude.

* * * * *